(12) United States Patent
Finkel et al.

(10) Patent No.: US 10,686,116 B2
(45) Date of Patent: Jun. 16, 2020

(54) THERMO-OPTICAL METHOD OF PHRASE TRANSFORMATIONAL TRANSDUCTION

(71) Applicant: The Government of the United States of America, as represented by the Secretary of the Navy, Arlington, VA (US)

(72) Inventors: Peter Finkel, Baltimore, MD (US); Margo Staruch, Alexandria, VA (US); Fletcher Blackmon, Plymouth, MA (US); Lynn Antonelli, Cranston, RI (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/998,482

(22) Filed: Aug. 16, 2018

(65) Prior Publication Data
US 2019/0058107 A1 Feb. 21, 2019

Related U.S. Application Data

(60) Provisional application No. 62/547,163, filed on Aug. 18, 2017.

(51) Int. Cl.
| | | |
|---|---|---|
| H01L 41/187 | (2006.01) |
| H01L 41/09 | (2006.01) |
| H02N 2/00 | (2006.01) |
| H04R 7/04 | (2006.01) |
| H01L 41/113 | (2006.01) |
| H01L 41/053 | (2006.01) |
| H04R 23/00 | (2006.01) |
| H04R 17/00 | (2006.01) |
| H04R 31/00 | (2006.01) |

(Continued)

(52) U.S. Cl.
CPC ...... *H01L 41/1875* (2013.01); *H01L 41/0536* (2013.01); *H01L 41/09* (2013.01); *H01L 41/1132* (2013.01); *H02N 2/009* (2013.01); *H04R 7/04* (2013.01); *H04R 17/00* (2013.01); *H04R 23/008* (2013.01); *H04R 23/02* (2013.01); *H04R 31/00* (2013.01); *H01L 41/18* (2013.01); *H04R 1/44* (2013.01); *H04R 23/002* (2013.01)

(58) Field of Classification Search
CPC . H01L 41/1875; H01L 41/0536; H01L 41/18; H01L 41/00; B81B 3/0024; B81B 3/0029; B81B 2201/04; C30B 11/007
See application file for complete search history.

(56) References Cited

U.S. PATENT DOCUMENTS

| | | | | |
|---|---|---|---|---|
| RE20,680 E * | 3/1938 | Sawyer | ............... | H04R 17/00 310/332 |
| 4,641,377 A * | 2/1987 | Rush | ............... | H04R 23/008 381/111 |

(Continued)

*Primary Examiner* — Fan S Tsang
*Assistant Examiner* — Angelica M Mckinney
(74) *Attorney, Agent, or Firm* — US Naval Research Laboratory; Roy Roberts (57) ABSTRACT

Described herein is the use of large phase transformational strain in relaxor ferroelectric single crystals for broadband sound generation. The technique exploits the thermo-optical triggering and thus an opto-acoustic effect of ferroelectric phase transformation piezocrystals under mechanical bias conditions.

6 Claims, 6 Drawing Sheets

(51) Int. Cl.
*H04R 23/02* (2006.01)
*H04R 1/44* (2006.01)
*H01L 41/18* (2006.01)

(56) References Cited

U.S. PATENT DOCUMENTS

| | | | |
|---|---|---|---|
| 8,604,676 B1* | 12/2013 | Finkel | H01L 41/187 |
| | | | 310/358 |
| 9,048,762 B1* | 6/2015 | Finkel | H01L 41/18 |
| 2001/0005272 A1* | 6/2001 | Buchholz | H04R 23/008 |
| | | | 398/134 |
| 2017/0155036 A1* | 6/2017 | Kubota | G02B 26/0833 |

* cited by examiner

THERMO-OPTICAL METHOD OF PHRASE TRANSFORMATIONAL TRANSDUCTION

CROSS-REFERENCE TO RELATED APPLICATIONS

This application claims the benefit of U.S. Provisional Application 62/547,163 filed on Aug. 18, 2017, the entirety of which is incorporated herein by reference.

BACKGROUND

Sound transduction can occur where high strain is induced in piezoelectric or magnetostrictive materials. In the case of piezoelectric and magnetic methods of transduction, a large strain is produced when these materials are driven by very high applied electric or magnetic field. This often requires a direct electric or magnetic field introduced to the transducer placed in a contact with the media. This limitation of required high voltage or current must be overcome by using the thermo-acoustic or optoacoustic transduction mechanism to achieve remote, contactless generation of acoustic waves.

The current state of the art in acoustic transduction utilizes piezoelectric ceramic materials that show high energy conversion efficiency. These materials directly convert a voltage (electric field) to displacement and therefore require a moderate amount of power. In recent years the development of relaxor ferroelectric single crystals has led to successive improvements in the transduction coupling in single crystals compared to piezoceramics making them extremely promising for sound generation, actuation, ultrasonic sensors for medical and naval applications (see refs. 1-3).

A need exists for new materials suitable for compact and robust acoustic sources, hydrophones, vector sensors and acoustic transducers. Furthermore, there is the need for direct electrical connection and control, requiring power at the transducer that severely limits applications of such transducers in hard to access or other remote locations.

BRIEF SUMMARY

Described herein is the use of large phase transformational strain in relaxor ferroelectric single crystals for broadband sound generation. The technique exploits the thermo-optical triggering and thus an opto-acoustic effect of ferroelectric phase transformation piezocrystals under mechanical bias conditions.

In one embodiment, a method of acoustic transduction includes providing a [011] poled crystal of $Pb(In_{1/2}Nb_{1/2})O_3$—$Pb(Mg_{1/3}Nb_{2/3})O_3$—$PbTiO_3$ (PIN-PMN-PT) subject to a compressive mechanical pre-loading stress and operably connected to a diaphragm; and heating the PIN-PMN-PT crystal with a laser thereby causing a phase transition in the PIN-PMN-PT crystal and emission of an acoustic signal from the diaphragm.

In another embodiment, an acoustic transducer comprises a [011] poled crystal of $Pb(In_{1/2}Nb_{1/2})O_3$—$Pb(Mg_{1/3}Nb_{2/3})O_3$—$PbTiO_3$ (PIN-PMN-PT) contained in a mount that subjects the PIN-PMN-PT crystal to a compressive mechanical pre-loading stress; a diaphragm operably connected to the PIN-PMN-PT crystal; and a source of laser light configured to optically heat the PIN-PMN-PT crystal sufficient to cause a phase transition in the PIN-PMN-PT crystal and emission of an acoustic signal from the diaphragm.

DETAILED DESCRIPTION

Definitions

Before describing the present invention in detail, it is to be understood that the terminology used in the specification is for the purpose of describing particular embodiments, and is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used herein, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

Overview

An alternative method of exication of piezoelectric ceramic materials is based on linear or non-linear optoacoustic or thermo-acoustic transduction. When high intensity light (i.e., laser) interacts with the media, it can create local temperature fluctuations and through thermal expansion or breakdown interactions, the generation of a sound pressure wave propagating in the media.

As described herein, direct large strain generation in piezomaterials is triggered by a remote light source similar to optoacoustic generation. This technique is expected to provide benefits from both methods to achieve an enhanced sound transduction with higher efficiency using a phase transformational strain generated by ferroelectric piezocrystals triggered thermo-optically.

Ferroelectric piezocrystals typically display a linear piezoelectric effect, but in some cases when subjected to external stress they can undergo phase transformation accompanied by a very sharp hysteretic strain. In some domain engineered single crystals, reversibly driven phase transformation between rhombohedral (R) and orthorhombic (O) symmetries in mechanically confined, [011] poled relaxor ferroelectric $Pb(In_{1/2}Nb_{1/2})O_3$—$Pb(Mg_{1/3}Nb_{2/3})O_3$—$PbTiO_3$ (PIN-PMN-PT) single crystals was realized that generated strains up to 0.5%. (see ref. 4). Utilizing this large reversible transformational strain would allow for further enhanced electromechanical transduction and high level of piezoelectric coupling as compared to the linear piezoelectric mode (see ref. 4). This transformation is due to rotation of polarization variants (P [111] and (P [−111]) and the switching from polydomain to monodomain, and can be achieved with relatively small change in external stimuli (see ref. 5).

Moreover, this transition can be triggered thermally and produce the same high level of strain under mechanical bias (see ref. 6).

The technique for capturing this large strain thermally is based on two principles: (1) mechanical confinement (mechanical bias, i.e., the application of a compressive mechanical pre-loading stress) close to the phase transition stress, and (2) stimulation with a relatively small change in temperature that induces phase transition.

EXAMPLES

A verification study was performed using PIN-PMN-PT single crystals 4×4×12 mm³ for testing. This domain engineering is necessary to be able to induce a rhombohedral to orthorhombic phase transformation with the application of uniaxial stress along the <001> direction of the crystal (long axis). The induced phase transformation occurs at some critical stress ($\sigma_c$) that can be accurately determined for each crystal. As the crystal is stressed past $\alpha_c$, a large voltage spike of ~800-1000 V is produced as well as a large jump in strain. Both of these occur with a rise time of <20 µs.

Figure 1:
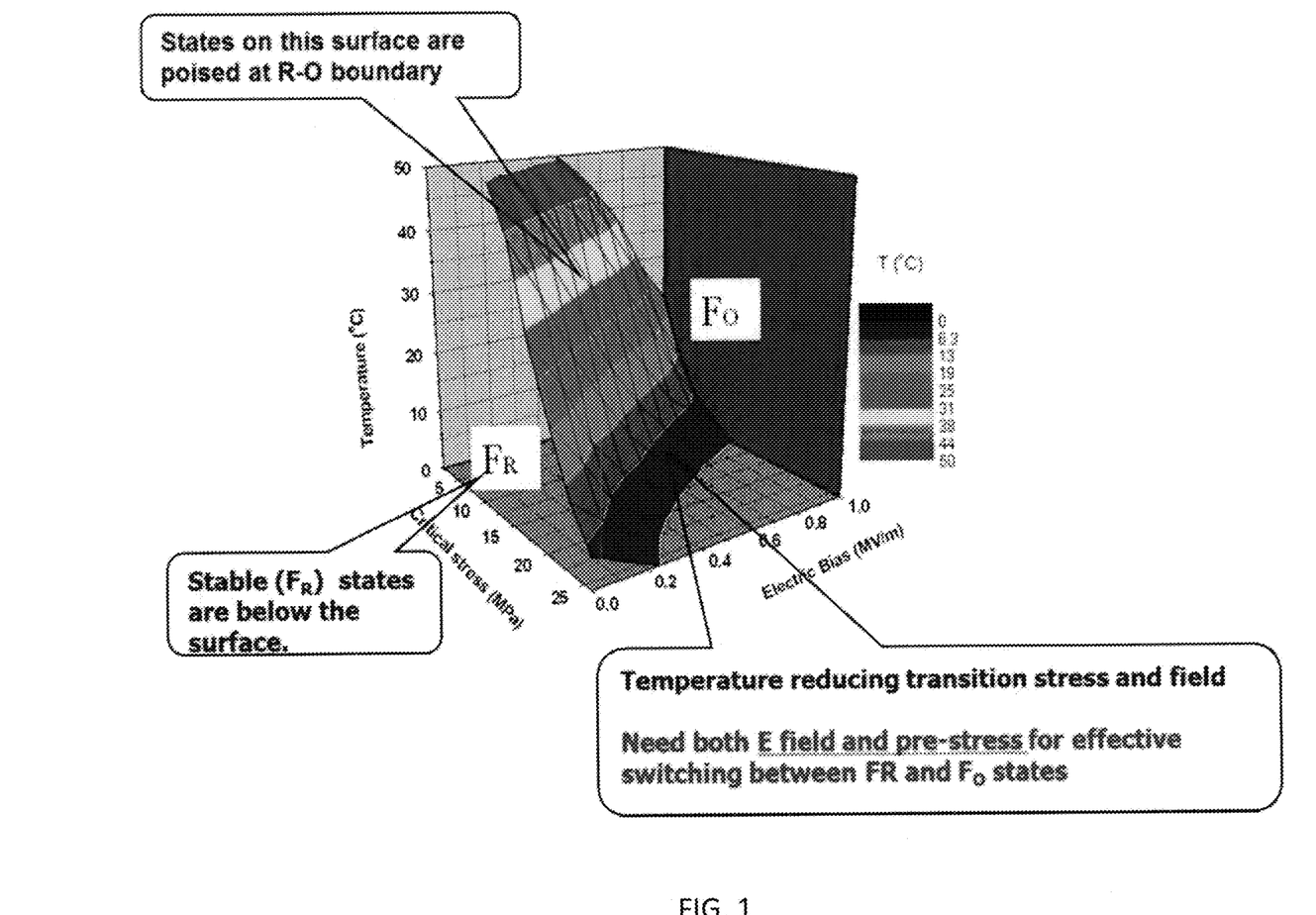
FIG. 1 illustrates the relationship between temperature, critical stress, and electric bias.
Figure 2A:
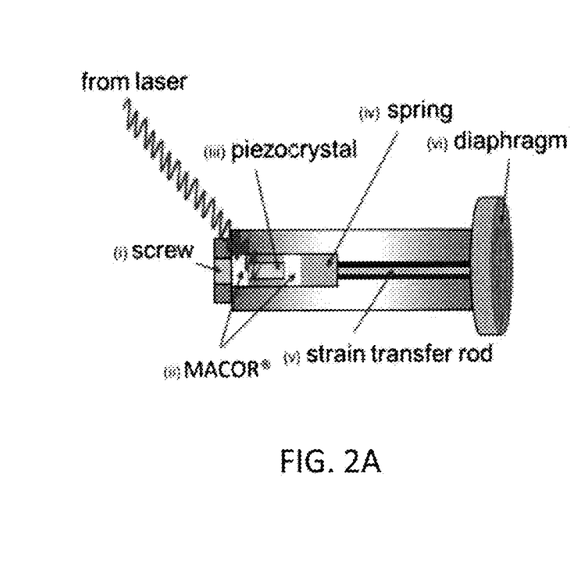
FIGS. 2A and 2B show contemplated transducer design.
Figure 2B:
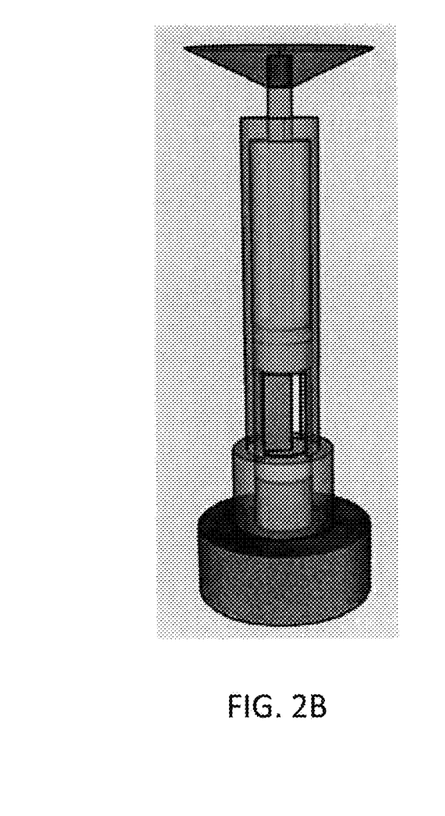
Figure 3:
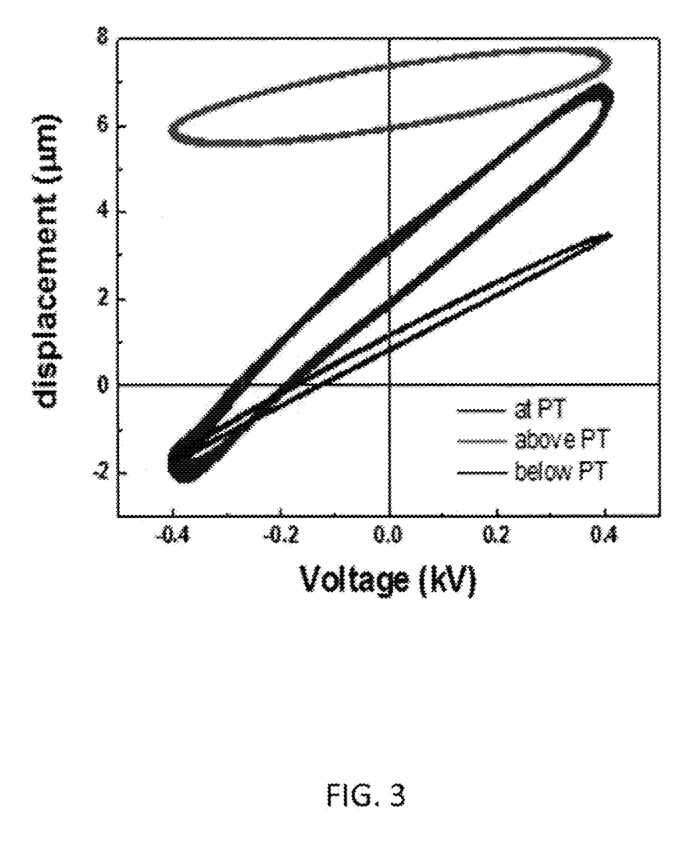
FIG. 3 shows displacement/voltage curves. Below the FR-Fo phase transition, the slope was 6 µm/kV, at the phase transition the slope was about 10 µm/kV, and above the phase transition (0) the slope was 2 µm/kV.
Figure 4:
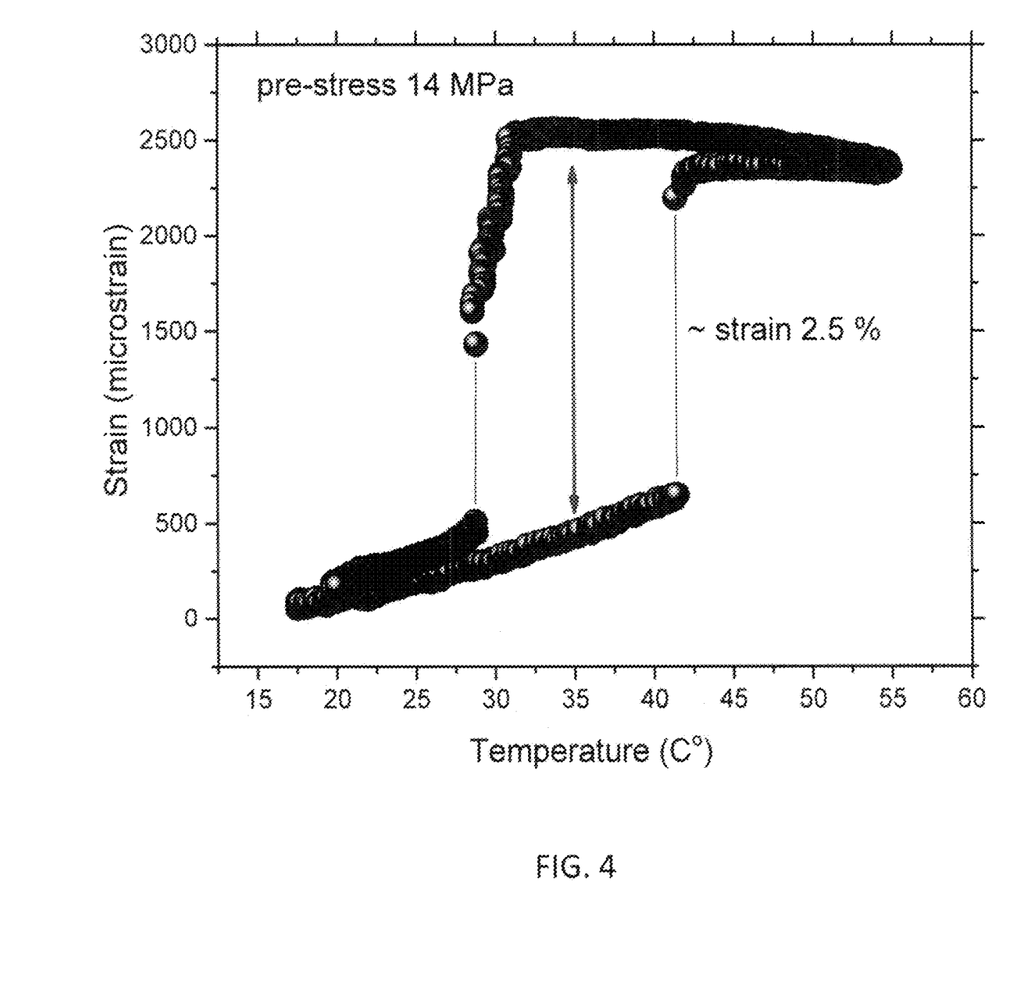
FIG. 4 shows results of testing was using mechanically biased poled PIN-PMN-PT single crystals.

The preliminary design of the transducer as shown in FIGS. 2A and 2B is an aluminum cylinder with two windows allowing for positioning of the crystal and for the wires to come out and to introduce light/optical power. The center of the cylinder has been bored out to hold the active piezoelectric crystal and other necessary components as shown in the cross-sectional schematic in FIG. 2A. The PIN-PMN-PT crystal (iii) is positioned between two MACOR® ceramic cylinders (ii) that have a layer of Kapton® tape on the side in contact for the crystal for additional compliance and electrical insulation. This sensor is designed for operation while the crystal is under uniaxial compressive stress. This is accomplished through the use of a polyurethane spring (iv) that will allow controllable stress when the screw (i) is tightened.

A strain transfer rod (v) is directly connected to a diaphragm (vi) that will convert a thermo-optically or on the piezocrystal pressure wave into a force. The base of the diaphragm is also machined out of aluminum and screws to the end of the aluminum cylinder. The base is then covered with a thin copper foil, and the strain transfer rod is fitted through the center and secured to the foil with two screws (one on either side). A window on the side of the fixture is also included for optical access to the PIN-PMN-PT crystal.

A prototype with a tonpilz configuration was fabricated for the ability to pre-load the crystal by pre-determined mechanical stress to bring it close to phase transition phase transition that can be triggered by either by (i) very low electric field of <2 kV/cm, (ii) by small stress variation (1-2 MPa) or (iii) thermo-optically.

Testing in air, holding the crystal near the critical stress and applying electric field, found an improvement of nearly four to six times in output displacement when the crystal undergoes phase transformation as compared to the linear piezoelectric effect in rhombohedral and orthorhombic phases. The output from the transducer was measured by displacement via laser Doppler velocimetry (LDV) and compared for several pre-loading conditions below, through and about critical stress. A much higher output was observed when the crystal undergoes phase transition (PT) as compared to linear regime (below the phase transition point).

To demonstrate thermally induced transition, preliminary testing was performed using the mechanically biased (pre-load ~14 MPa) [011] poled PIN-PMN-PT single crystals. Only a low temperature change with gradient of about 10° C. above room temperature was needed to generate ~0.25% strain in the crystal when it undergoes phase switching reversibly at zero electric field. This effect can be achieved by heating the crystal optically by a laser (green continuous wave) beam impinging on the crystal and heating it above the phase transitional temperature, resulting in thermo-acoustic generation. By employing lasers for thermal heating of the single crystal, non-contact acoustic generation with high conversion efficiency is realized over a range of frequencies. This phenomenon opens a prospect to use this material for remote stimulation and to provide a high level of transduction amplification.

Figure 5:
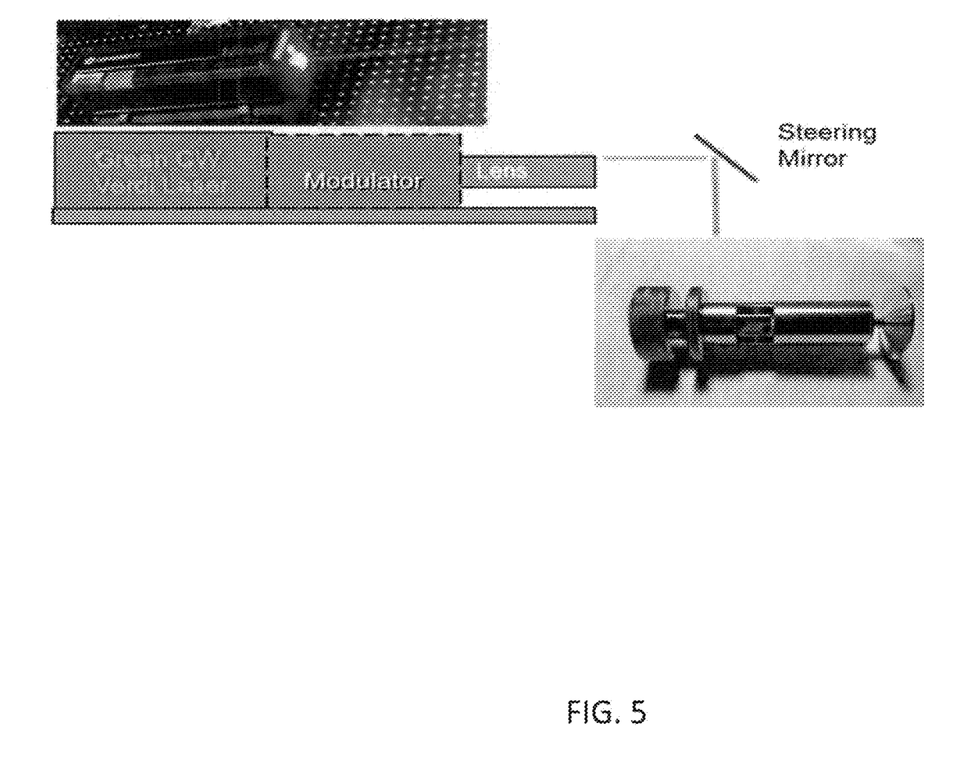
FIG. 5 is a composite depiction showing an arrangement for thermo-acoustic generation.
Figure 6:
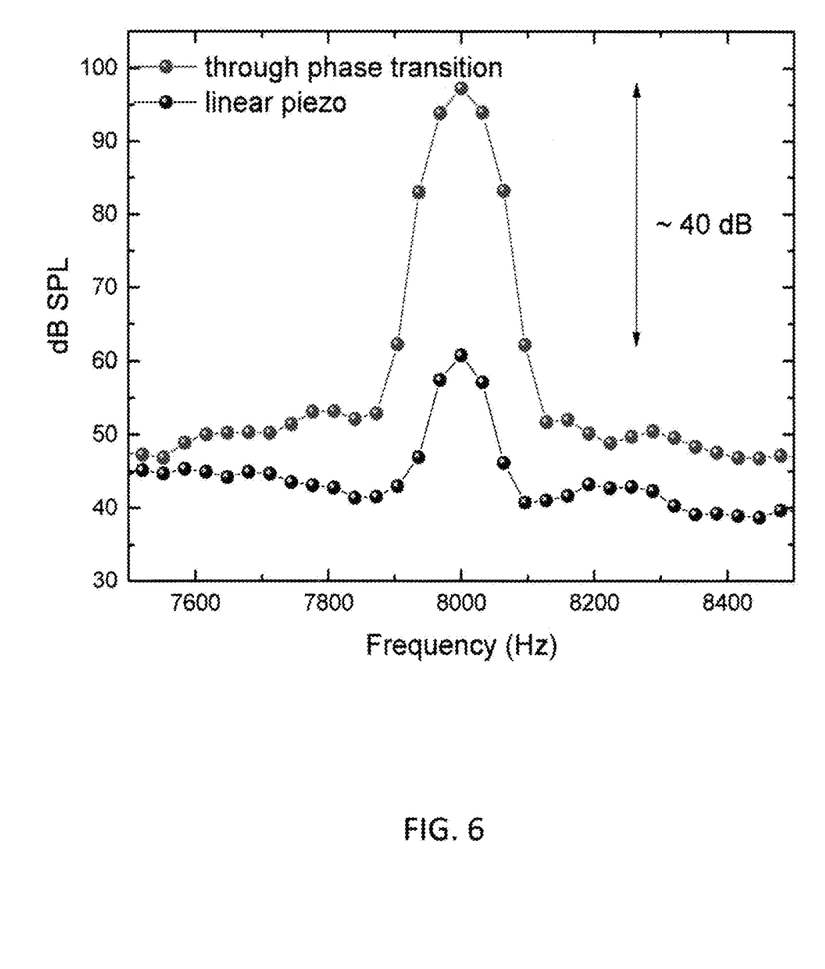
FIG. 6 provides data showing the large increase in sound pressure level (SPL) produced when the threshold for phase transition is crossed.

FIG. 5 shows large increase in sound pressure level (SPL) produced when the threshold for phase transition is crossed.

Further Embodiments

A similar effect could be achieved through laser heating of high thermal expansion coefficient materials designed specifically for this mode of operation. Expansion of this component would then result in the application of the critical stress to the crystal to induce the transition and therefore produce the large strain with potentially lower requirements on the optical source used for heating.

An alternative approach could involve integration of an optical control of the power circuitry that would allow for remote on/off control of the transducer (using a laser based sensing mechanism such as a photodetector), which would then be driven electrically.

Advantages

This technique provides a broadband transduction capability utilizing large output displacement at phase transformation in single crystals that would produce high amplification of sound waves by relatively small triggering input power, remotely delivered thermo-optically which yield zero-power electrical input with distinct advantages as compared to other methods of transduction that need power.

This can be achieved successfully by harnessing this intrinsic material state switching phenomenon for acoustic transducer with even greater performance than conventional ceramic or even single crystal-based projectors currently under development.

Accordingly, one can expect three significant advantages: First, the generation of large phase transformational strain resulting from external excitation (electrical, mechanical or thermal) of mechanically biased piezocrystals should allow a broad band of operating frequencies, ranging from low (near DC) to high operating frequencies without change in performance and not limited to a particular resonant frequency. Second, direct thermo-optical excitation of phase transition is expected to allow for transformational strain generation at zero input electric power conditions. Third, there can be contact-less, remote triggering of electrically driven phase transition conditions.

CONCLUDING REMARKS

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

REFERENCES

1. J. Kuwata, K. Uchino, and S. Nomura, *Ferroelectrics,* 37, p. 579 (1981).
2. J. Kuwata, K. Uchino, and S. Nomura, *Jpn. J. Appl. Phys.,* 21, p. 1298 (1982).
3. S. E. Park and T. R. Shrout, *J. Appl. Phys.,* 82, 1804 (1997).
4. P. Finkel, A. Amin, K. Benjamin, "Large strain transduction utilizing phase transition in relaxor-ferroelectric Pb In1/2Nb1/2 . . . O3-Pb, Mg1/3Nb2/3 . . . O3-PbTiO3 single crystals" *Appl. Phys. Lett.,* 98, 192902 (2011)
5. P. Finkel, A. Amin, S. Lofland, J. J. Yao, D. Viehland. "Phase switching at low field and large sustainable strain output in domain engineered ferroic crystals," *Physica Status Solidi A—Applications and Materials Science,* 209 (11) 2108. (2012)
6. W. D. Dong, P. Finkel, A. Amin, C. S. Lynch. "Stress dependence of thermally driven pyroelectric charge release during FER-FEO phase transformations in [011] cut relaxor ferroelectric crystals," *Applied Physics Letters,* 100 (26) 262909. (2012)

What is claimed is:

1. A method of acoustic transduction comprising:
    providing a [011] poled crystal of $Pb(In_{1/2}Nb_{1/2})O_3$—$Pb(Mg_{1/3}Nb_{2/3})O_3$—$PbTiO_3$ (PIN-PMN-PT) subject to a compressive mechanical pre-loading stress and operably connected to a diaphragm; and
    heating the PIN-PMN-PT crystal with a laser thereby causing a phase transition in the PIN-PMN-PT crystal, wherein the phase transition is sufficient to cause emission of an acoustic signal from the diaphragm.

2. The method of claim 1, wherein a strain transfer rod transfers movement of the PIN-PMN-PT crystal to the diaphragm.

3. The method of claim 1, wherein the laser is a green continuous wave laser.

4. An acoustic transducer comprising:
    a [011] poled crystal of $Pb(In_{1/2}Nb_{1/2})O_3$—$Pb(Mg_{1/3}Nb_{2/3})O_3$—$PbTiO_3$ (PIN-PMN-PT) contained in a mount that subjects the PIN-PMN-PT crystal to a compressive mechanical pre-loading stress;
    a diaphragm operably connected to the PIN-PMN-PT crystal; and
    a source of laser light configured to optically heat the PIN-PMN-PT crystal sufficient to cause a phase transition in the PIN-PMN-PT crystal, wherein the phase transition is sufficient to cause emission of an acoustic signal from the diaphragm.

5. The acoustic transducer of claim 4, further comprising a strain configured to transfer movement of the PIN-PMN-PT crystal to the diaphragm.

6. The acoustic transducer of claim 4, wherein the laser is a green continuous wave laser.

* * * * *

UNITED STATES PATENT AND TRADEMARK OFFICE
CERTIFICATE OF CORRECTION

| | | |
|---|---|---|
| PATENT NO. | : 10,686,116 B2 | Page 1 of 1 |
| APPLICATION NO. | : 15/998482 | |
| DATED | : June 16, 2020 | |
| INVENTOR(S) | : Peter Finkel et al. | |

It is certified that error appears in the above-identified patent and that said Letters Patent is hereby corrected as shown below:

On the Title Page

And in the Specification, the Title reading:
"THERMO-OPTICAL METHOD OF PHRASE TRANSFORMATIONAL TRANSDUCTION"
Should read:
-THERMO-OPTICAL METHOD OF PHASE TRANSFORMATIONAL TRANSDUCTION- Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*